United States Patent [19]
Boos et al.

[11] Patent Number: 6,133,593
[45] Date of Patent: Oct. 17, 2000

[54] CHANNEL DESIGN TO REDUCE IMPACT IONIZATION IN HETEROSTRUCTURE FIELD-EFFECT TRANSISTORS

[75] Inventors: J. Brad Boos, Springfield, Va.; Ming-Jey Yang, Silver Spring, Md.; Brian R. Bennett, Arlington, Va.; Doewon Park, Herndon, Va.; Walter Kruppa, Fairfax, Va.

[73] Assignee: The United States of America as represented by the Secretary of the Navy, Washington, D.C.

[21] Appl. No.: 09/358,649

[22] Filed: Jul. 23, 1999

[51] Int. Cl.[7] .................................................. H01L 29/778
[52] U.S. Cl. .............................................. 257/194; 257/27
[58] Field of Search .................................. 257/24, 26, 27, 257/194

[56] References Cited

U.S. PATENT DOCUMENTS

| | | | |
|---|---|---|---|
| 5,151,757 | 9/1992 | Enoki et al. | 257/194 |
| 5,258,632 | 11/1993 | Sawada | 257/194 |
| 5,798,540 | 8/1998 | Boos et al. | 257/194 |

*Primary Examiner*—John Guay
*Attorney, Agent, or Firm*—Barry A. Edelberg; George A. Kap

[57] ABSTRACT

Heterostructure field-effect transistors (HFETs) and other electronic devices are fabricated from a series of semiconductor layers to have reduced impact ionization. On to a first barrier layer there is added a unique second subchannel layer having high quality transport properties for reducing impact ionization. A third barrier layer having a controlled thickness to permit electrons to tunnel through the layer to the subchannel layer is added as a spacer for the fourth main channel layer. A fifth multilayer composite barrier layer is added which has at least a barrier layer in contact with the fourth channel layer and on top a sixth cap layer is applied. The device is completed by adding two ohmic contacts in a spaced apart relationship on the sixth cap layer with a Schottky gate between them which is formed in contact with the fifth barrier layer. The second subchannel layer and the fourth main channel layers are made of materials which have the proper respective energy gaps and ground state energies such that during use the transfer of hot electrons from the main channel into the subchannel is made probable to reduce impact ionization in the main channel. In the preferred AlSb/InAs-based HFETs, the use of an Is InAs subchannel layer under the main InAs channel improves the performance of the HEMTs particularly for gate lengths in the deep-submicron regime. The devices exhibit higher transconductance, lower output conductance, reduced gate leakage current, higher operating drain voltage, and improved frequency performance.

23 Claims, 2 Drawing Sheets

CHANNEL DESIGN TO REDUCE IMPACT IONIZATION IN HETEROSTRUCTURE FIELD-EFFECT TRANSISTORS

BACKGROUND OF THE INVENTION

1. Field of the Invention

This invention relates to a new channel design to reduce impact ionization in heterostructure field-effect transistors (HFETs).

2. Description of the Related Art

Future generations of microwave and millimeter-wave radar, communications, electronic warfare, smart weapons, and imaging systems will require higher precision, smaller size, increased bandwidth, lower operating voltages, and lower cost of production. To meet the demand for improved high-frequency performance, considerable effort within the past ten years has focused on the development of GaAs-based and InP-based high-electron-mobility transistors (HEMTs).

As a result, a variety of HEMT circuits have been fabricated which operate at higher frequencies and have improved power, efficiency, gain, and noise figure performance. The primary factors responsible for the improved HEMT performance have been the increase in the In mole fraction in the $In_xGa_{1-x}As$ channel and the increase in the conduction band offset at the 2DEG interface. As a result of these improvements, InP-based HEMTs have distinct millimeter-wave performance advantages compared to GaAs-based HEMTs, and currently hold the record in frequency response and noise figure for any FET.

In the longer term, AlSb/InAs-based HEMTs may be more attractive than InP-based HEMTs for some of the above applications due to the substantially improved material properties of this heterojunction system. Higher electron mobility and higher electron velocity can be achieved with an InAs channel compared to $In_xGa_{1-x}$ channels. The lower electron effective mass of InAs gives this material system a significant advantage in the room-temperature mobility which can be achieved for a given HEMT sheet charge density. Due to the large $\Gamma$-L valley separation, InAs also has the substantial advantage of a higher electron peak velocity ($4 \times 10^7$ cm/sec) compared to the other semiconductors. The considerably larger conduction band discontinuity($\Delta E_c$= 1.35 eV) at the donor layer/channel interface enables the formation of a deeper quantum well and the associated benefits of a larger two dimensional electron gas (2DEG) sheet charge density, superior carrier confinement, and improved modulation efficiency. These features should enable improved scaling of the current-gain cutoff frequency ($f_T$) as the gate length is reduced to the nanometer range.

In addition to the increased high-frequency performance potential, InAs-channel HEMTs are also attractive for applications requiring low-voltage operation. The higher electron mobility and velocity, lower threshold field, and reduced access resistance capability enable the attainment of higher effective velocity at a significantly lower drain voltage.

Although improvements have been made in recent years, the material growth and fabrication technology for AlSb/InAs HFETs is relatively immature. The high reactivity of AlSb in air and the low valence-band offset of the AlSb/InAs heterojunction increase the complexity of the material growth and device design requirements. AlSb/InAs-based HFETs have previously been fabricated with barrier layers which include AlSb, AlGaSb, AlSbAs, AlGaSbAs, and a superlattice consisting of AlSb/AlAs. Each of these approaches has advantages and disadvantages relating to growth complexity, stability, conduction band and valence band offset, and insulator effectiveness.

Reduction of the impact ionization in the devices, however, has yet to be addressed. The HEMTs are susceptible to significant charge control problems associated with impact ionization in the InAs channel due to its narrow bandgap of 0.36 eV at room temperature. These effects become increasingly pronounced as the gate length is reduced due to the higher fields present, thus hindering the high-frequency performance of short-gate length HEMTs and limiting their operating voltage range.

We have found that the large 1.35 eV conduction band offset of the AlSb/InAs heterojunction offers unique opportunities to reduce impact ionization effects by using channel layer designs that exploit quantum confinement in this region. The dc and microwave characteristics of 0.1 $\mu$m AlSb/InAs HEMTs exhibit reduced impact ionization and improved charge control due to the addition of a thin InAs subchannel in the HEMT design.

3. Objects of the Invention

It is an object of this invention to provide improved heterostructure field-effect transistors (HFETs) to reduce impact ionization.

It is a further object of this invention to provide improved HFETs to exhibit higher transconductance.

It is a further object of this invention to provide improved HFETs to exhibit lower output conductance.

It is a further object of this invention to provide improved HFETs to exhibit reduced gate leakage current.

It is a further object of this invention to provide improved HFETs to exhibit higher operating drain voltage.

It is a further object of this invention to provide improved HFETs to exhibit improved frequency performance.

It is a further object of this invention to provide improved HFETs to improve voltage gain.

It is a further object of this invention to provide improved HFETs to improve power gain.

It is a further object of this invention to provide improved HFETs by adding the design flexibility gained by being able to tune the ground state of the main channel and a new sub-channel by choosing the proper thickness of the respective quantum wells.

These and further objects of the invention will become apparent as the description of the invention proceeds.

SUMMARY OF THE INVENTION

An electronic device having reduced impact ionization is fabricated from a series of semiconductor layers. On a first barrier layer of a semiconductor material there is added a unique second subchannel layer of a semiconductor material having high quality transport properties for reducing impact ionization. A third barrier layer of a semiconductor material, having a controlled thickness so as to permit electrons to tunnel through the layer to the subchannel layer, is added to space apart the next fourth main channel layer of a semiconductor material. A fifth multilayer composite of semiconductor materials is added which has at least a barrier layer in contact with the fourth channel layer. Finally a sixth cap layer of a semiconductor material is applied. To make these combined layers into a working device two ohmic contacts are disposed on the sixth cap layer and a Schottky gate is formed in contact with the fifth barrier layer. The second subchannel layer and the fourth main channel layers are made of materials which have the proper respective energy gaps and ground state energies such that during use the transfer of hot electrons from the main channel into the subchannel is made probable to reduce impact ionization in the main channel.

In the preferred AlSb/InAs-based heterostructure field-effect transistors (HFETs), the use of an InAs subchannel layer under the main InAs channel improves the performance of the HEMTs particularly for gate lengths in the deep-submicron regime. The devices exhibit higher transconductance, lower output conductance, reduced gate leakage current, higher operating drain voltage, and improved frequency performance.

DESCRIPTION OF THE PREFERRED EMBODIMENTS

A semiconductor electronic device is described herein which can operate at high frequencies exceeding 100 GHz. The parameters which characterize the high frequency performance include noise figure, short-circuit current gain, and maximum available gain.

The semiconductor device of this invention can be fabricated in a manner that is conventional for such devices with the exception of the isolation process which is carried out with a novel etchant which can etch InAs, $In_xAl_{1-x}As_ySb_{1-y}$, AlSb, and doped GaSb but not GaAs or a Au-containing metal alloy.

Suitable semiconductor materials are selected from Groups III-V semiconductor elements of the Periodic Table such as indium, aluminum, gallium, arsenic, antimony, phosphorus, and the like. Sb-based semiconductors for device applications are also suitable herein particularly for their unique electronic and optoelectronic properties. This includes the use of wide and narrow band gap materials. Examples of wide band gap materials include InPSb, AlPSb, InAlAs, InAlAsSb, and AlGaAsSb. Examples of narrow band gap materials include InAs, GaSb and InSb. Of special interest herein is a semiconductor device wherein the buffer layer is AlSb, the barrier layers are AlSb and $In_xAl_{1-x}As_ySb_{1-y}$, and the channel layer is InAs. The semiconductor materials can be deposited on a suitable substrate, preferably GaAs, by molecular beam epitaxy in a conventional manner.

Figure 1:
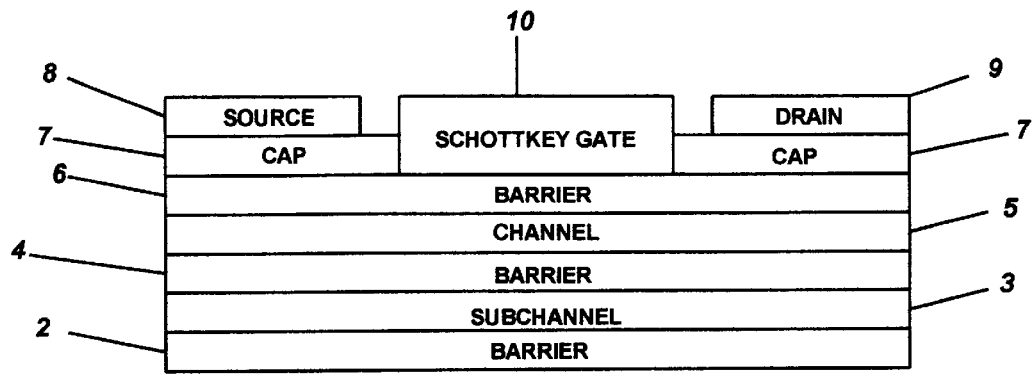
FIG. 1 is a cross-sectional view of a HEMT starting material.

The key component layers to this electronic device which reduces impact ionization are illustrated in FIG. 1.

The device 1 has a first barrier layer 2. Above it the new second subchannel layer 3 and above it is third barrier layer 4 of a semiconductor material. Next is the fourth main channel layer 5 and a fifth barrier layer 6 of a semiconductor material. A sixth cap layer 7 covers most of the barrier layer 6 except where the Schottky gate 10 is in contact with the barrier layer 6. On top of the sixth cap layer 7 are two ohmic contacts referred to as a source 8 and a drain 9 and the Schottky gate 10 is in between and in contact with the fifth barrier layer 6.

The thickness of the various layers is as follows: the first barrier layer 2, typically 50–5000 Å, more typically 100–1000 Å; the second subchannel layer 3, typically 10–200 Å, more typically 25–50 Å; the third barrier layer 4, typically 10–100 Å, more typically 20–50 Å; the fourth channel layer 5; typically 10–500 Å; more typically 50–300 Å; the fifth barrier layer 6, typically 30–1550 Å, more typically 50–300 Å; and the sixth cap layer 7, typically 5–200 Å, more typically 10–50 Å.

In an especially preferred embodiment, the electronic device 11 is a HEMT fabricated by depositing layers of semiconductor materials in sequence by means of molecular beam epitaxy.

Figure 2:
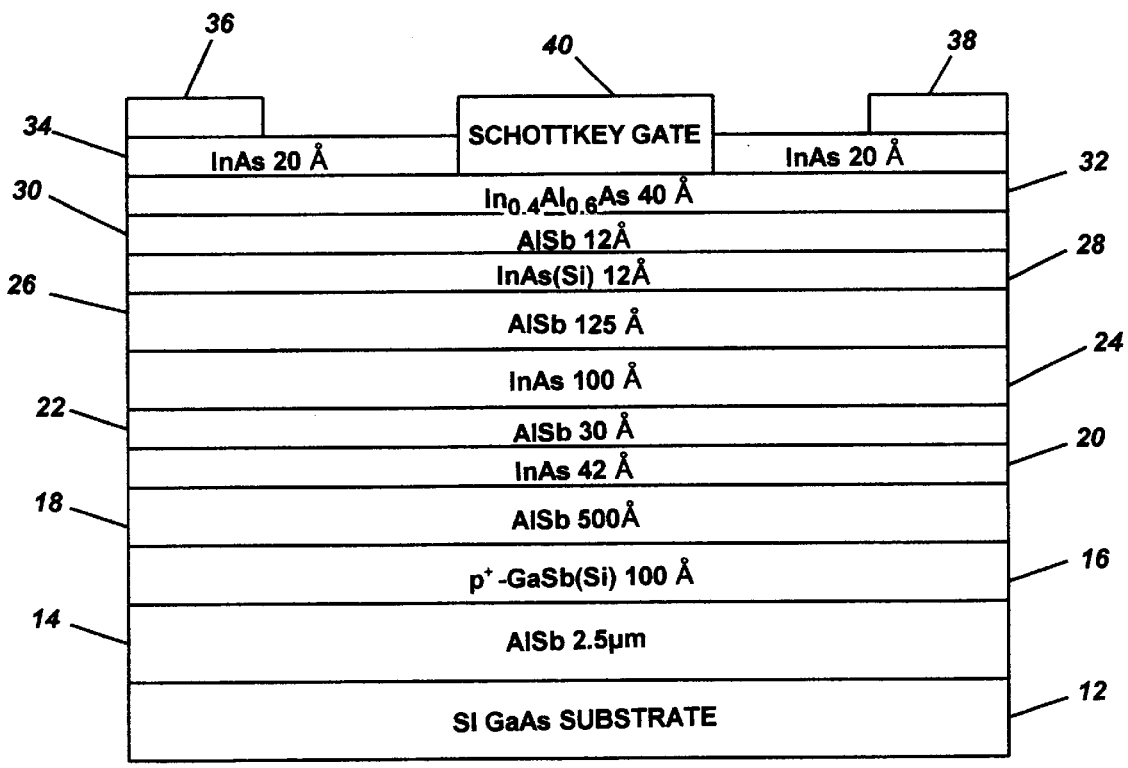
FIG. 2 is a cross-sectional view of a preferred HEMT starting material.

As shown in FIG. 2, the layers are deposited on a substrate from the bottom up.

A cross section of the device 11, showing the material layer design, is shown in FIG. 2. The AlSb/InAs HEMT material was grown by molecular beam epitaxy on a semi-insulating (100) GaAs substrate 12. A 2.5 μm undoped AlSb buffer layer 14 was used to accommodate the 7% lattice mismatch. After the growth of the buffer layer, a 100 Å p⁺-GaSb hole layer 16 is grown next, followed by a 500 Å AlSb buffer layer 18, a 42 Å InAs subchannel layer 20, a 30 Å AlSb barrier layer 22, a 100 Å InAs channel layer 24, a 125 Å AlSb barrier layer 26, a 12 Å InAs doping layer 28 doped with Si, a 12 Å AlSb barrier layer 30, a 40 Å $In_{0.4}Al_{0.6}As$ barrier layer 32, and finally a 40 Å InAs cap layer 34.

The source 36 and drain 38 metallizations were then formed on layer 34 and preferably heat treated to minimize contact resistance and thus form ohmic contacts. Gate 40 is disposed on layer 32.

The thickness of the various layers is as follows: AlSb layer 14, typically 0.1–10 microns, more typically 1–5 microns; p⁺ doped GaSb layer 16, typically 10–1000 Å, more typically 50–300 Å; AlSb layer 18, typically 50–5000 Å, more typically 100–1000 Å; InAs subchannel layer 20, typically 10–200 Å more typically 25–50 Å; AlSb layer 22, typically 10–100 Å, more typically 20–50 Å; InAs channel layer 24, typically 10–50 Å; more typically 50–300 Å; AlSb layer 26, typically 10–50 Å, more typically 50–300 Å; InAs doping layer 28 doped with Si, typically 550 Å, more typically 10–30 Å; AlSb layer 30, typically 5–500 Å, more typically 10–200 Å; $In_xAl_{1-x}As_ySb_{1-y}$ barrier layer 32, typically 10–500 Å, more typically 20–200 Å; and InAs cap layer 34, typically 5–200 Å, more typically 10–50 Å.

The source and drain contacts 36, 38 should be thick enough to provide a low contact resistance between the contacts and the semiconductor material. Heat treatment yields ohmic contacts with low contact resistance. Although any suitable contact material can be used, preferred is a contact containing a palladium layer in contact with layer 34 of the device 11, a barrier layer above the palladium layer, and gold layer above the barrier layer. The barrier layer can be platinum, titanium, titanium tungsten, platinum silicide, titanium carbide, tungsten carbide, or a mixture thereof. Preferred barrier material is platinum. Thickness of the contact layer before heat treatment is as follows: palladium layer, typically 10–1000 Å; more typically 50–500 Å; barrier layer, typically 50–1000 Å, more typically 100–500 Å; and gold layer, typically 100–5000 Å, more typically 200–2000 Å.

For a basic disclosure on the general fabrication of a device of this nature, see Boos et al U.S. Pat. No. 5,798,540, the entire contents of which is incorporated herein by reference.

Figure 3:
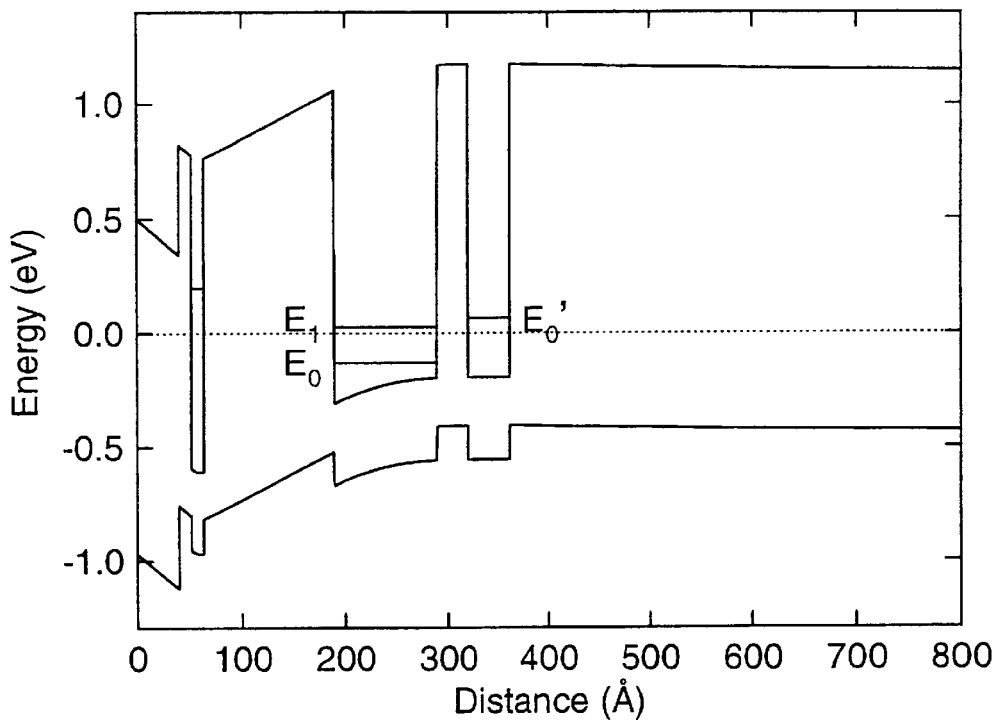
FIG. 3 is a calculated energy band diagram for the HEMT of FIG. 1.

The energy band diagram for $V_{GS}=0$ obtained from a self-consistent calculation is shown in FIG. 3, where the Poisson equation, the 2D density of states, and the non-parabolicity in the InAs quantum wells have been taken into account. See F. C. Wang et al, *Appl. Phys. Lett.*, vol. 69, no. 10, pp. 1417–1419, 1996.

Modulation doping was achieved through the use of a thin Si-doped InAs layer 28 located 125 Å above the 100 Å undoped InAs channel 24. The large confinement energy of the 12 Å InAs quantum well 28 allows the electrons to transfer into the InAs main channel 24. Modulation doping using a thin Si-doped InAs layer located below the channel has previously been used to fabricate AlSb/InAs inverted HEMTs as discussed in Y. Zhao et al, *IEEE Trans. on Electron Devices*, vol. 45, no. 1, pp. 341–342, 1998.

The $In_{0.4}Al_{0.6}As$/AlSb composite barrier of layers 32 and 30 respectively enables the use of a gate recess etch into the upper barrier material prior to gate metal definition, which otherwise would be prohibited by the high reactivity of the AlSb in air. The composite barrier layer is a more effective insulator and is more chemically stable. The improved stability has enabled a conventional gate recess process to be employed which is similar to that which is used in GaAs-based and InP-based HEMT fabrication.

The 100 Å Si-doped GaSb layer 16 ($p\sim 3\times 10^{17}$ cm$^{-3}$) located 500 Å below the InAs subchannel 20 is intended to drain a portion of the impact-ionization-generated holes back to the source contact 36 rather then allowing them to remain in the AlSb buffer layers 14 or 18. See J. B. Boos et al, *InP and Related Materials Conference Proceedings*, pp. 671–674, 1998. With this design, a portion of the holes which diffuse from the channel 24 into the AlSb buffer layer are confined within the p$^+$ GaSb valence band energy well where they are channeled back to the source contact 36 by the applied electric field. Without the p$^+$ GaSb layer 16, the holes would continue to diffuse into the AlSb buffer 18 where they are more likely to cause deleterious trapping effects.

In order to reduce impact ionization effects in the device, a key feature of the present invention is the introduction of a thin InAs undoped subchannel layer 20, which due to quantization has a larger effective bandgap. The 42 Å subchannel layer 20 is separated from the 100 Å InAs channel 24 by 30 Å of AlSb buffer layer 22. This buffer layer 22 must have a controlled thickness so it is thick enough to confine electrons in the main channel layer at low electric fields and to confine the electrons in the subchannel layer at high electric fields, but thin enough so electrons can tunnel through to the subchannel layer. The room temperature Hall mobility and sheet carrier concentration of the starting material for the HEMTs were 20,000 cm$^2$/Vs and $1.9\times 10^{12}$ cm$^{-2}$, respectively which indicates a good quality of starting material.

The use of an InAs subchannel layer under the main InAs channel reduces the impact ionization in the device. The addition of this layer improves the performance of the HEMTs particularly for gate lengths in the deep-submicron regime.

Composite channel designs have previously been used in InP-based HEMTs to increase breakdown voltage as discussed by T. Enoki et al, "Design and characteristics of InGaAs/InP composite-channel HFET's," *IEEE Trans. on Electron Devices*, vol. 42, no. 8, pp. 1413–1418, 1995. Although this composite channel design has been shown to be effective in reducing impact ionization, the optimization of this design approach is constrained due to its limited band-gap engineering design flexibility and its critical dependence on the doping level of the two layers.

In the present invention, however, the subchannel has a larger effective bandgap due to its higher ground-state subband energy. Electrons are transferred from the main channel to the subchannel before gaining enough kinetic energy for impact ionization.

As shown in the calculated band structure of FIG. 3, the thickness of the subchannel was chosen so that not only its lowest subband ($E_0'$) lies slightly above the second subband ($E_1$) of the main InAs channel at $V_{GS}=0$ V, but also $E_0'-E_0$ is smaller than the effective bandgap of the main channel. The effective band gap of the main channel is the energy separation between the top of the valence band edge (lower curve on the graph) and the lowest subband energy ($E_0$). When the device is under an increasing negative gate bias, the separation between $E_1$ and $E_0'$ is reduced. As $E_1$ and $E_0'$ are aligned, the possibility for electrons resonantly tunneling into the subchannel through $E_1$ is strongly enhanced. Electrons can also undergo real space transfer to the subchannel by incoherent tunneling. As a result, the extent of impact ionization in the channel is reduced, since the electrons do not have to remain in the main channel where they would gain enough kinetic energy for impact ionization. Thus the subchannel layer and the main channel layer are made of the same or different materials which have the proper respective energy gaps and ground state energies such that during use the transfer of hot electrons from the main channel into the subchannel is made probable to reduce impact ionization in the main channel. The reduction of impact ionization is reflected in the measured device characteristics which show reduced output conductance, increased transconductance, increased voltage gain, and decreased inductive shift in the S22 scattering parameter which is a typical measured parameter used to characterize the microwave characteristics of the device.

An advantage of this approach is the design flexibility gained by being able to tune the ground state of the channel and sub-channel by choosing the proper thickness of the respective quantum wells. One also has the flexibility to use different materials in the subchannel to further bandgap engineer the subchannel design. The subchannel wells may contain different materials with larger bandgaps (eg. InPSb, GaSb, InGaAs). By being able to vary the alloy composition and thickness, a wide range of possibilities exist to exploit the use of quantization and reduce impact ionization in the device. An additional advantage is that the sub-channel layer design can be optimized without paying the penalty of additional process complexity, since the fabrication process would not be changed by the modifications.

The need for the subchannel design is paramount, in particular, for HEMTs fabricated with gate lengths in the deep-submicron regime. HEMTs with 20–200 nm gate lengths are particularly susceptible to impact-ionization effects due to the higher fields present under the gate. In previous AlSb/InAs HEMT designs, the FET characteristics of 0.1 μm gate length HEMTs were observed to be significantly worse due to the effects of impact ionization in the channel. With this new InAs subchannel design, 0.1 μm gate length AlSb/InAs HEMTs exhibit substantially improved high frequency performance, and currently represent the state-of-the art for this material system.

AlSb/InAs-based HEMTs reported thus far suffer from high gate leakage current due to the relatively poor insulating quality of the thin barrier layer and the large number of holes which are present in the channel due to impact ionization at relatively low drain voltages. A substantial portion of these impact-ionization-generated holes surmount or tunnel through the small gate barrier present and appear as additional gate leakage current. Reduction of the gate current is essential for low-noise performance. The microwave noise measured on previous AlSb/InAs HEMTs was dominated by the gate leakage current shot noise. By reducing the extent of gate leakage current resulting from holes generated by impact ionization, the noise performance can be improved. Impact ionization also sets the limit on the maximum operating drain voltage of the devices. With lower impact ionization in the channel, the devices can be operated at higher drain voltages which increases the maximum power output.

Impact ionization and subsequent undesirable hole trapping can also result in a "kink effect" in the HEMT drain characteristics as discussed by W. Kruppa et al, *InP and Related Materials Conference Proceedings*, pp. 458–461, 1996. The kink causes degraded performance at nominal bias values and precludes the use of the devices at fields where optimum performance could be expected. The increase in drain current results from the presence of additional positive charge which has a positive gating effect. Only weak impact ionization is necessary for the effect to occur, provided that a sufficient number of hole traps are available. This material system is particularly susceptible to the hole trapping since, due to the staggered band lineup of the AlSb/InAs heterojunction, there exists only a minimal valence band barrier to limit hole flow into the adjacent barrier and buffer layers. Reducing impact ionization in the channel will lower the population of holes available for trapping, thus minimizing the kink effect in the devices.

The AlSb/InAs HEMT performance with the improved design is expected to improve considerably in HEMTs with higher sheet charge density and mobility, lower access resistance and lower gate metal resistance, all of which appear feasible. The combination of the improved design and fabrication method and the improved material properties of this heterojunction system will make AlSb/InAs-based HEMTs attractive candidates in future technologies where high speed, gain, and efficiency at low bias voltage will be required.

Finally, the salient features of the new design may be applicable in FET designs which utilize other III-V-based semiconductor materials, including the AlGaAs/GaAs, InAlAs/InGaAs/InP, AlGaN/GaN, InAlSb/InSb, Si and SiGe material systems. Here the unique and attractive features of the sub-channel design previously described for the AlSb/InAs HEMT may also apply. Significantly higher breakdown voltages may be achieved due to reduced impact ionization in the channel. The increased breakdown voltages also can be achieved without the penalty of decreased frequency response. As mentioned previously, InP-based HEMTs have distinct millimeter-wave performance advantages compared to GaAs-based HEMTs, and currently hold the record in frequency response and noise figure for any three-terminal semiconductor device. However their present low-noise and power performance is limited by impact ionization, and the subchannel design described in this invention may significantly reduce impact ionization and improve performance in these areas. Sb-based semiconductors for device applications are also receiving more attention in recent years due their unique electronic properties. In particular, wide-band gap materials such as InPSb, AlPSb, AlInSbAs, and AlGaSbAs and the narrow band gap materials of InAs, GaSb and InSb have unique, attractive features for future electronic, optoelectronic, and nanoelectronic applications. The new design and fabrication improvements should enable Sb-based HFETs to be reproducibly formed with enhanced performance and increased operating voltages.

Having described the basic aspects of the invention, the following example is given to illustrate a specific embodiment thereof.

EXAMPLE 1

This example demonstrates preparation of HEMTs of this invention and certain advantages realized in conjunction with HEMTs provided with a subchannel design to reduce impact ionization.

A cross section of the device 10, showing the material layer design, is shown in FIG. 1. The AlSb/InAs HEMT material was grown by molecular beam epitaxy on a semi-insulating (100) GaAs substrate 12. A 2.5 μm undoped AlSb buffer layer 14 was used to accommodate the 7% lattice mismatch between the HEMT material and the GaAs substrate 12. After the growth of the buffer layer, a 100 Å $p^+$ GaSb layer 16 is grown next, followed by a 500 Å AlSb layer 18, a 42 Å InAs subchannel layer 20, a 30 Å AlSb layer 22, a 100 Å InAs channel layer 24, a 125 Å AlSb layer 26, a 12 Å InAs layer 28 doped with Si, a 12 Å AlSb layer 30, a 40 Å $In_{0.4}Al_{0.6}As$ layer 32, and finally a 20 Å InAs cap layer 34.

The HEMTs were fabricated using standard photolithographic and liftoff techniques. The source-drain contact patterns were defined first using a PMMA-based resist and deep UV lithography. Pd/Pt/Au (100 Å/200 Å/600 Å) source and drain contact metalizations were then formed using e-beam evaporation, acetone liftoff, and heat treatment at 175° C. using a hot plate which is located within a glove box containing a $H_2:N_2$(5%:95%) ambient. See J. B. Boos et al, *InP and Related Materials Conference Proceedings*, pp. 354–357, 1996, and J. B. Boos, "A Pd/Pt/Au Ohmic Contact Metallization for AlSb/InAs-based Heterostructures," U.S. application Ser. No. 08/826,110, filed Mar. 27, 1997, the entire contents of which is incorporated herein by reference. The subject matter of the patent application has been published as "Ohmic contacts in AlSb/InAs HEMTs for Low Voltage Operation," J. Vac. Sci. Technol. B, vol 17, no. 3 pg 1022–1027 (1999). The sample was heat treated for 3 hours to ensure sufficient reaction of the Pd. The Schottky-gate contact is Cr/Au formed using PMMA-based e-beam lithography and lift-off techniques. Finally, device isolation was achieved by wet chemical etching. The isolation etch simultaneously forms an air-bridge between the channel and the gate bonding pad to reduce leakage current and allows for complete removal of the AlSb buffer layer material in the field. The sheet carrier density and mobility of the starting material, determined by Hall measurement at 300K were $1.9 \times 10^{12}$ $cm^2$ and 20,000 $cm^2/Vs$.

Figure 4:
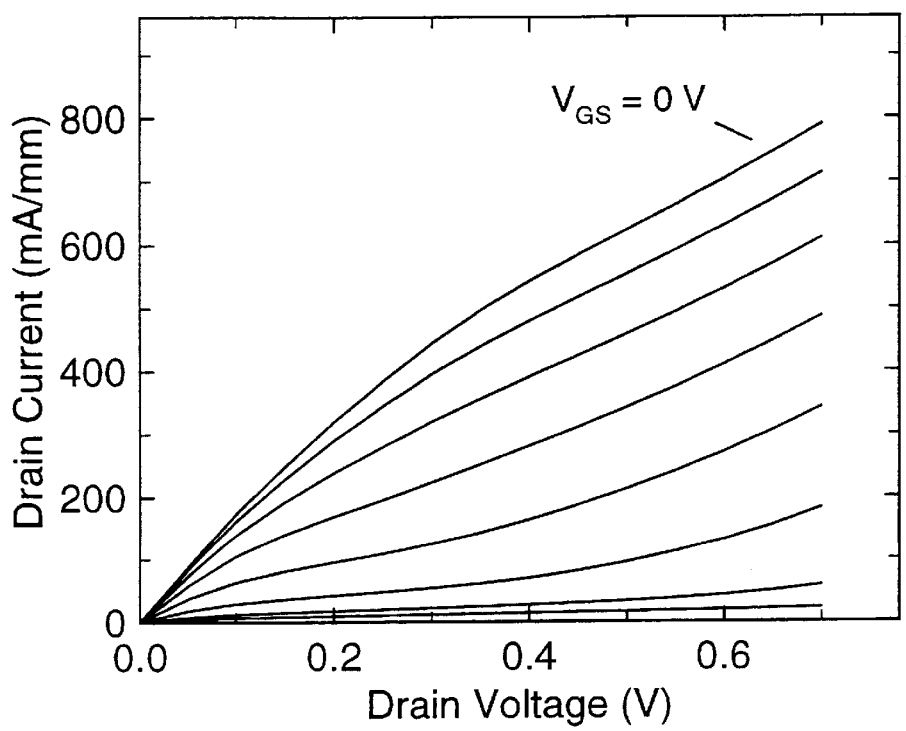
FIG. 4 is a graph of drain current vs. drain voltage of the HEMT of Ex. 1.

A typical set of drain characteristics for HEMTs with a 0.1 μm gate length is shown in FIG. 4.

The low-field source-drain resistance at $V_{GS}$=0 V is 0.55 Ω-mm. At $V_{DS}$=0.5 V, a transconductance above 800 mS/mm is observed from $V_{GS}$=−0.1 to −0.5 V, with a maximum value of 1.3 S/mm occurring at $V_{GS}$=−0.35 V. When compared to similar devices without the subchannel, these devices exhibit lower output conductance, particularly at more negative gate biases.

The S-parameters of the HEMTs were measured on-wafer from 1 to 40 GHz. Based on the usual 6 dB/octave extrapolation, an $f_T$ and $f_{max}$ of 180 GHz and 80 GHz, respectively, at $V_{DS}$=0.6 and $V_{GS}$=−0.4 V were obtained. Using a simplified equivalent circuit, the microwave transconductance and output conductance for a 100 μm gate width device were 850 mS/mm and 200 mS/mm, respectively, corresponding to a microwave voltage gain of 4.2 at this bias condition. Compared to previous 0.1 μm devices of similar design such as discussed by J. B. Boos et al, "DC, small-signal, and noise characteristics of 0.1 μm AlSb/InAs HEMTs," *InP and Related Materials Conference Proceedings*, pp. 193–196, 1997, the devices exhibit a higher transconductance and a lower gate-source capacitance which is believed to be primarily due to the improved charge control as a result of the addition of the InAs subchannel. After removal of the gate bonding pad capacitance from the equivalent circuit, an $f_T$ of 250 GHz was obtained, which is the highest reported for this material system. Optimization of the subchannel layer design is needed to fully exploit the reduction of impact ionization in the channel using this approach.

It is understood that the foregoing detailed description is given merely by way of illustration and that many variations may be made therein without departing from the spirit of this invention.

What is claimed is:

1. An electronic device comprising the following layers disposed on a substrate:
    a barrier layer of a semiconductor material;
    a subchannel layer of a semiconductor material;
    an intermediate barrier layer of a semiconductor material having a controlled thickness so as to permit electrons to tunnel through the intermediate barrier layer to the subchannel layer and to confine electrons in a main channel layer at low electric fields and to confine the electrons in the subchannel layer at high electric fields;
    a main channel layer of a semiconductor material;
    a multilayer composite layer of semiconductor materials having at least a barrier layer in contact with the channel layer;
    a cap layer of a semiconductor material;
    two ohmic contacts disposed on the cap layer; and
    a Schottky gate in contact with the multilayer composite layer;
        wherein the subchannel layer and the main channel layer are made of the same or different materials which have the proper respective energy gaps and ground state energies such that during use the transfer of hot electrons from the main channel layer into the subchannel layer is made probable to reduce impact ionization in the main channel layer.

2. An electronic device according to claim 1, wherein the subchannel layer does not contain any dopant or any level of a dopant which would act to in increase impact ionization in the device.

3. An electronic device according to claim 1, wherein the subchannel layer and the main channel layer are made of the same or different materials selected from the group consisting of InAs, InPSb, GaSb, InGaAs, AlGaAs/GaAs, InAlAs/InGaAs/InP, AlGaN/GaN, InAlSb/InSb, Si, SiGe, AlPSb, AlInSbAs, AlGaSbAs, InSb and combinations thereof.

4. An electronic device according to claim 1, wherein the multilayer composite layer comprises:
    a barrier layer of a semiconducting material in contact with the main channel layer;
    a doping layer of a semiconducting material, and
    an upper barrier layer of a semiconducting material in contact with the cap layer.

5. An electronic device according to claim 4, wherein the doping layer is InAs doped with Si.

6. An electronic device according to claim 4, wherein the intermediate barrier layer is AlSb.

7. An electronic device according to claim 4, wherein the multilayer composite layer is a composite layer made of two layers where the lower layer has high reactivity in air and the upper layer is made of a protective material which protects the reactive lower material from air and which enables the use of a gate recess etch into the upper barrier material prior to gate metal definition whereby the composite barrier layer is a more effective insulator, is more chemically stable, and the improved stability enables a conventional gate recess process to be employed.

8. An electronic device according to claim 7, wherein the multilayer composite layer is a composite layer made of a lower layer of AlSb and an adjacent upper layer of $In_{0.4}Al_{0.6}As$.

9. An electronic device according to claim 1, wherein the subchannel layer has a larger effective bandgap due to its higher ground-state subband energy so that electrons are transferred from the main channel layer to the subchannel layer before gaining enough kinetic energy for impact ionization.

10. An electronic device according to claim 1, wherein the thickness of the subchannel is selected so its lowest subband ($E_0'$) lies slightly above the second subband ($E_1$) of the main channel at $V_{GS}=0$ V, and so the $E_0'-E_0$ value is smaller than the effective bandgap of the main channel.

11. An electronic device according to claim 1, wherein the intermediate barrier layer between the subchannel layer and the main channel layer is selected to have a minimal size to increase the probability of electron tunneling through the barrier layer.

12. An electronic device according to claim 11, wherein the intermediate barrier layer has a thickness of 20–50 Å.

13. An electronic device according to claim 1, wherein thickness of the layers is as follows:
    the barrier layer is about 50–5000 Å;
    the subchannel layer is about 10–200 Å;
    the intermediate barrier layer is about 10–100 Å;
    the main channel layer is about 10–500 Å;
    the multilayer composite is about 30–1550 Å; and
    the cap layer is about 5–200 Å.

14. An electronic device according to claim 1, wherein thickness of the layers is as follows:
    the barrier layer is about 100–1000 Å;
    the subchannel layer is about 25–50 Å;
    the intermediate barrier layer is about 20–50 Å;
    the main channel layer is about 50–300 Å;
    the multilayer composite is about 90–730 Å; and
    the cap layer is about 10–50 Å.

15. An electronic device of claim 1, wherein said ohmic contact is Pd/barrier/Au.

16. An electronic device of claim 15, wherein said ohmic contact thickness is as follows: palladium layer, about 50–500 Å; barrier layer, about 100–500 Å; and gold layer, about 200–2000 Å; and wherein said barrier in said ohmic contact is selected from the group consisting of platinum, titanium, titanium tungsten, platinum silicide, titanium carbide, titanium silicide, and combinations thereof.

17. An electronic device of claim 1, wherein each of said two ohmic contacts is Pd/Pt/Au having respective thickness of about 100 Å, 200 Å, and 600 Å; and said Schottky gate is Cr/Au.

18. An electronic device comprising the following layers disposed on a GaAs substrate:
    a first AlSb layer disposed on said substrate;
    a $p^+$ GaSb layer disposed on the AlSb layer;

a third AlSb layer disposed on the p+GaSb layer and having a controlled thickness so as to permit electrons to tunnel through the AlSb layer to a subchannel layer and to confine electrons in a main channel layer at low electric fields and to confine the electrons in the subchannel layer at high electric fields;

a fourth InAs subchannel layer disposed on the said third AlSb layer;

a fifth AlSb layer disposed on said fourth InAs subchannel layer and having a controlled thickness so as to permit electrons to tunnel through the layer to the subchannel layer;

a sixth InAs channel layer disposed on the said fifth AlSb layer;

a seventh AlSb layer disposed on said sixth InAs channel layer;

an eighth InAs(Si) layer disposed on said seventh AlSb layer;

a ninth AlSb layer disposed on said eight InAs(Si) layer;

a tenth $In_xAl_{1-x}As_ySb_{1-y}$ layer containing at least In, Al and As disposed on said ninth AlSb layer;

an InAs cap layer disposed on said tenth $In_xAl_{1-x}As_ySb_{1-y}$ layer;

two ohmic contacts disposed on the InAs cap layer; and a Schottky gate disposed between the ohmic contacts and being in contact with said tenth $In_xAl_{1-x}As_ySb_{1-y}$ layer, wherein the second subchannel layer and the fourth main channel layer have the proper respective energy gaps and ground state energies such that during use the transfer of hot electrons from the main channel into the subchannel layer is made probable to reduce impact ionization in the main channel.

19. An electronic device according to claim 18, wherein thickness of the layers is as follows:

the first AlSb layer is about 0.1–10 microns;

the p⁺ doped GaSb layer is about 10–1000 Å;

the third AlSb layer is about 50–5000 Å;

the fourth InAs subchannel layer is about 10–200 Å;

the fifth AlSb layer is about 10–100 Å;

the sixth InAs channel layer is about 10–500 Å;

the seventh AlSb layer is about 10–500 Å;

the eighth InAs doping layer doped with Si is about 5–50 Å;

the ninth AlSb layer is about 5–500 Å;

the tenth $In_xAl_{1-x}As_ySb_{1-y}$ barrier layer is about 10–500 Å; and the InAs cap layer is about 5–200 Å.

20. An electronic device according to claim 18, wherein thickness of the layers is as follows:

the first AlSb layer is about 1–5 microns;

the p⁺ doped GaSb layer is about 50–300 Å;

the third AlSb layer is about 100–1000 Å;

the fourth InAs subchannel layer is about 25–50 Å;

the fifth AlSb layer is about 20–50 Å;

the sixth InAs channel layer is about 50–300 Å;

the seventh AlSb layer is about 50–300 Å;

the eighth InAs doping layer doped with Si is about 10–30 Å;

the ninth AlSb layer is about 10–200 Å;

the tenth $In_xAl_{1-x}As_ySb_{1-y}$ barrier layer is about 20–200 Å; and the InAs cap layer is about 10–50 Å.

21. An electronic device of claim 18, wherein said ohmic contact is Pd/barrier/Au.

22. An electronic device of claim 21, wherein said ohmic contact thickness is as follows: palladium layer, about 50–500 Å: barrier layer, about 100–500 Å; and gold layer, about 200–2000 Å; and wherein said barrier in said ohmic contact is selected from the group consisting of platinum, titanium, titanium tungsten, platinum silicide, titanium carbide, titanium silicide, and combinations thereof.

23. An electronic device of claim 18, wherein each of said two ohmic contacts is Pd/Pt/Au having respective thickness of about 100 Å, 200 Å, and 600 Å; and said Schottky gate is Cr/Au.

* * * * *